(12) United States Patent
Guan et al.

(10) Patent No.: US 12,014,258 B2
(45) Date of Patent: Jun. 18, 2024

(54) METHOD AND DEVICE FOR OPTIMIZING SIMULATION DATA, AND COMPUTER-READABLE STORAGE MEDIUM

(71) Applicant: Baidu Online Network Technology (Beijing) Co. Ltd., Beijing (CN)

(72) Inventors: Chenye Guan, Beijing (CN); Feihu Zhang, Beijing (CN); Ruigang Yang, Beijing (CN); Liang Wang, Beijing (CN); Yu Ma, Beijing (CN)

(73) Assignee: Baidu Online Network Technology (Beijing) Co. Ltd., Beijing (CN)

( * ) Notice: Subject to any disclaimer, the term of this patent is extended or adjusted under 35 U.S.C. 154(b) by 888 days.

(21) Appl. No.: 16/508,903

(22) Filed: Jul. 11, 2019

(65) Prior Publication Data
US 2020/0082250 A1 Mar. 12, 2020

(30) Foreign Application Priority Data
Sep. 6, 2018 (CN) .......................... 201811038346.5

(51) Int. Cl.
*G06N 3/045* (2023.01)
*G06F 17/18* (2006.01)
(Continued)

(52) U.S. Cl.
CPC .............. *G06N 3/045* (2023.01); *G06F 17/18* (2013.01); *G06F 30/20* (2020.01); *G06N 3/047* (2023.01)

(58) Field of Classification Search
CPC ...... G06N 3/0454; G06N 3/0472; G06N 3/08; G06F 30/20; G06F 17/18
(Continued)

(56) References Cited

U.S. PATENT DOCUMENTS 10,262,243 B2 * 4/2019 Lim ..................... G06F 18/2413
2018/0293713 A1 * 10/2018 Vogels .................... G06K 9/627
(Continued)

FOREIGN PATENT DOCUMENTS

CN 107464210 A 12/2017
CN 107977511 A 5/2018
(Continued)

OTHER PUBLICATIONS

Lahiri, Avisek, "Generative adversarial learning for reducing manual annotation in semantic segmentation on large scale miscroscopy images: Automated vessel segmentation in retinal fundus image as test case." (IEEE, 2017) Proceedings of the IEEE conference on computer vision and pattern recognition (Year: 2017).*
(Continued)

*Primary Examiner* — Rehana Perveen
*Assistant Examiner* — Daniel E Miller
(74) *Attorney, Agent, or Firm* — Knobbe, Martens, Olson & Bear, LLP (57) ABSTRACT

A method, device and a computer-readable storage medium for optimizing simulation data are provided. The method for optimizing simulation data can include: inputting the simulation data generated by a simulator to a first generative adversarial network comprising a migration model; and optimizing the simulation data generated by the simulator with the migration model to generate optimized simulation data. In an embodiment of the present application, the simulation data is optimized by the generative adversarial network to enable the simulation data closer to the real data in representation. Therefore, the quality and accuracy of the simulation data can be ensured, the validity and reliability of the simulation data can be improved at least to some extent, and the cost for constructing the simulator can also be reduced.

18 Claims, 4 Drawing Sheets

--- inputting the simulation data generated by a simulator to a first generative adversarial network including a migration model — S110 optimizing the simulation data generated by the simulator with the migration model to generate the optimized simulation data — S120

(51) Int. Cl.
    *G06F 30/20*     (2020.01)
    *G06N 3/047*     (2023.01)

(58) Field of Classification Search
    USPC .......................................................... 706/15
    See application file for complete search history.

(56) References Cited

U.S. PATENT DOCUMENTS

| | | | |
|---|---|---|---|
| 2018/0307947 A1* | 10/2018 | Choi | G06K 9/6201 |
| 2019/0050632 A1* | 2/2019 | Weng | G06K 9/6267 |
| 2019/0080148 A1* | 3/2019 | He | G06V 40/165 |
| 2019/0080433 A1* | 3/2019 | He | G06T 3/4007 |

FOREIGN PATENT DOCUMENTS

| | | |
|---|---|---|
| CN | 108197700 A | 6/2018 |
| CN | 108226892 A | 6/2018 |
| CN | 108319932 A | 7/2018 |
| JP | 2015-79339 A | 4/2015 |

OTHER PUBLICATIONS

Lahiri, Avisek, Arnav Jain, Prabir Kumar Biswas, and Pabitra Mitra. "Improving consistency and correctness of sequence inpainting using semantically guided generative adversarial network." arXiv preprint arXiv:1711.06106 (2017). (Year: 2017).*
Liu, Yen-Cheng, Wei-Chen Chiu, Sheng-De Wang, and Yu-Chiang Frank Wang. "Domain-Adaptive generative adversarial networks for sketch-to-photo inversion." In 2017 IEEE 27th International Workshop on Machine Learning for Signal Processing (MLSP), pp. 1-6. IEEE, 2017. (Year: 2017).*
Shrivastava, Ashish, Tomas Pfister, Oncel Tuzel, Joshua Susskind, Wenda Wang, and Russell Webb. "Learning from simulated and unsupervised images through adversarial training." In Proceedings of the IEEE conference on computer vision and pattern recognition, pp. 2107-2116. 2017. (Year: 2017).*
Yu, Jiahui, Zhe Lin, Jimei Yang, Xiaohui Shen, Xin Lu, and Thomas S. Huang. "Generative image inpainting with contextual attention." (Arxiv, 2018) arxiv > cs > arXiv: 1801.07892. pp. 1-15. <https://doi.org/10.48550/arXiv.1801.07892> (Year: 2018).*
Achlioptas, Panos, Olga Diamanti, Ioannis Mitliagkas, and Leonidas Guibas. "Learning Representations and Generative Models for 3D Point Clouds." arXiv e-prints (2018): arXiv-1707. https://arxiv.org/pdf/1707.02392v3.pdf (Year: 2018).*
Yoo, Donggeun, Namil Kim, Sunggyun Park, Anthony S. Paek, and In So Kweon. "Pixel-level domain transfer." In Computer Vision-ECCV 2016: 14th European Conference, Amsterdam, the Netherlands, Oct. 11-14, 2016, Proceedings, Part VIII 14, pp. 517-532. Springer International Publishing, 2016. (Year: 2016).*
Kelly, Tom, Paul Guerrero, Anthony Steed, Peter Wonka, and Niloy J. Mitra. "FrankenGAN: guided detail synthesis for building mass-models using style-synchonized GANs." arXiv preprint arXiv:1806.07179 (Jun. 2018). (Year: 2018).*
Ganapathi-Subramanian, Vignesh, Olga Diamanti, Soeren Pirk, Chengcheng Tang, Matthias Niessner, and Leonidas J. Guibas. "Parsing Geometry Using Structure-Aware Shape Templates." arXiv preprint arXiv:1808.01337 (Aug. 2018). (Year: 2018).*
Mirza, Mehdi, and Simon Osindero. "Conditional generative adversarial nets." arXiv preprint arXiv:1411.1784 (2014). (Year: 2014).*
Frome, Andrea, et. al. "Recognizing objects in range data using regional point descriptors." In Computer Vision-ECCV 2004: 8th European Conference on Computer Vision, Prague, Czech Republic, May 11-14, 2004. Proceedings, Part III 8, pp. 224-237. Springer Berlin Heidelberg, 2004. (Year: 2004).*
Lalonde, Jean-François, Nicolas Vandapel, Daniel F. Huber, and Martial Hebert. "Natural terrain classification using three-dimensional ladar data for ground robot mobility." Journal of field robotics 23, No. 10 (2006): 839-861. (Year: 2006).*
Chen, Tongtong, Bin Dai, Daxue Liu, and Jinze Song. "Performance of global descriptors for velodyne-based urban object recognition." In 2014 IEEE Intelligent Vehicles Symposium Proceedings, pp. 667-673. IEEE, 2014. (Year: 2014).*
European Search Report dated Jan. 30, 2020 for Application No. 19184301.0, 10 pages.
Lahiri, et al., Generative Adversarial Learning for Reducing Manual Annotation in Semantic Segmentation on Large Scale Miscroscopy Images: Automated Vessel Segmentation in Retinal Fundus Images as Test Case, 2017 IEEE Conference on Computer Vision and Pattern Recognition Workshops, Jul. 21, 2017, pp. 794-800.
Karacan, et al., "Learning to Generate Images of Outdoor Scenes from Attributes and Semantic Layouts," arxiv.org, Cornell University Library, 201 Olin Library Cornell University Ithaca, NY 14853, Dec. 30, 2016, XP080735988.
Shrivastava, et al., "Learning from Simulated and Unsupervised Images through Adversarial Training," ARXIV-1611.07004V2, Jul. 19, 2017, pp. 2242-2251, XP055658523.
Goto et al., "Fast Learning-based Super-resolution Image Reconstruction Method Utilizing TV Regularization", vol. 65, No. 11, pp. 1621-1627, (2011).
Notice of Reasons for Refusal received in Japanese Application No. 2019-109840 drafted on Aug. 4, 2020 in 9 pages.
Ma, et al., "Super-Resolution of Remote Sensing Images Based on Transferred Generative Adversarial Network", IGARSS 2018-2018 IEEE International Geoscience and Remote Sensing Symposium, 4 pages.
Wang, et al., "http://www.doc88.com/p-3522525401124.html", Aug. 3, 2019, 17 pages.
Search Report dated Jul. 3, 2019 for Chinese Application No. 2018110383465, 4 pages.
Office Action dated Jul. 9, 2019 for Chinese Application No. 2018110383465, 19 pages.
State Intellectual Property Office Search Report, Chinese Application No. 2018110383465, dated Feb. 19, 2020 in 5 pages.
Bousmalis, et al., "Using Simulation and Domain Adaptation to Improve Efficiency of Deep Robotic Grasping", 8 pages, (IEEE, 2018).
European Office Action of Oct. 6, 2021 for European Patent Application No. 19184301.0. 6 pages.

\* cited by examiner

METHOD AND DEVICE FOR OPTIMIZING SIMULATION DATA, AND COMPUTER-READABLE STORAGE MEDIUM

CROSS-REFERENCE TO RELATED APPLICATION

This application claims priority to Chinese Patent Application No. 201811038346.5, entitled "Method, Device for optimizing simulation data, and Computer-readable storage medium", and filed on Sep. 6, 2018, which is hereby incorporated by reference in its entirety.

TECHNICAL FIELD

The present application relates to a field of information technology, and in particular, to a method, device for optimizing simulation data, and a computer-readable storage medium.

BACKGROUND

Simulation is also called emulation, wherein an essential process in a real system is reproduced by using a model to study an existing system or a system under design through experiments according to a model of such a system. Simulation is a particularly effective method when the studied system is expensive, dangerous to perform experiments, or when it is required a long time to know consequences caused by changes in system parameters. In general, the simulation of a complex system is realized by properly describing physical laws related thereto. However, a simulator accuracy is often severely restrained by a large amount of noise and unknown rules in the system.

A data set of points on an outer surface of an object to be detected by a measuring instrument (such as a laser radar) is also called a point cloud. When a laser beam is irradiated on the surface of the object, the reflected laser beam carries information such as an orientation and a distance. If scanning with the laser beam according to a certain path, it is possible to record information of the reflected laser points while scanning. Since the scanning is performed extremely finely, a large number of laser points can be acquired, and a laser point cloud can be formed.

Considering the accuracy of the laser point cloud for describing three-dimensional data, it can be regarded as a main carrier of the system information for studying. A point cloud is generated by the simulator mainly through simulating a measuring instrument in transmitting a laser beam and receiving a reflected signal.

In order to ensure and improve the data quality of the point cloud, data screening, increasing priori knowledge and the like are used in existing arts. Here, in data screening, an abnormal value is filtered out based on a statistical property of an object distribution in the point cloud, an accuracy of object detection, and the like. Increasing priori knowledge is performed by increasing types of objects and using multiple postures of objects to expand and detail a material database.

The accuracy of the simulation data depends on the accuracy of the simulator obtained in simulating a process of generating the point cloud data by the laser radar in the real world. However, the real world is an extremely complex system. The accuracy of the simulator based on the known physical knowledge is limited. For example, the accuracy of the simulator will be limited to a certain extent in a case that the point cloud becomes sparser with the increase of a distance, or in a case that the laser encounters different objects, which has different reflection rules under the influence of ambient noises. However, there are drawbacks in the existing solutions of point cloud correction, such as data screening and increasing priori knowledge. The solution of data screening mainly depends on sufficient samples of a high quality in the simulation data and requires these sample to have sufficient diversity, which puts a high requirements to the simulator, rendering great difficulty in realizing. To increase priori knowledge, it is necessary to consume human resources and material resources to collect information of an object and construct a three-dimensional model, and it will be an endless work for a complex system.

SUMMARY

A method, device for optimizing simulation data, and a computer-readable storage medium are provided according to embodiments of the present application, so as to at least solve the above technical problems in the existing technology.

According to a first aspect, a method for optimizing simulation data includes: inputting the simulation data generated by a simulator to a first generative adversarial network comprising a migration model; and optimizing the simulation data generated by the simulator with the migration model to generate optimized simulation data.

In conjunction with the first aspect, in a first implementation of the first aspect of the present application, the first generative adversarial network further comprises a first discriminative model; and the method further includes training the first generative adversarial network by: inputting the simulation data generated by the simulator to the migration model, optimizing the simulation data generated by the simulator with the migration model, and outputting a first optimized simulation data; inputting real data and the first optimized simulation data to the first discriminative model, and generating an authenticity probability of the first optimized simulation data by the first discriminative model; and according to the authenticity probability, training the first generative adversarial network by competing and learning with the migration model and the first discriminative model.

In conjunction with the first aspect, in a second implementation of the first aspect of the present application, the optimizing the simulation data generated by the simulator with the migration model, and outputting the optimized simulation data comprises: in a feed process of the migration model, generating loss output data of each sub-network of the migration model by using a residual neural network; combining the loss output data of all sub-networks and input data to obtain combined data, and providing the combined data to a loss function of the migration model to update the loss function; and optimizing the simulation data generated by the simulator through the updated loss function.

In conjunction with the first implementation of the first aspect, in a third implementation of the first aspect of the present application, the generating an authenticity probability of the first optimized simulation data by the first discriminative model comprises: performing statistical analysis to a loss degree of the first discriminative model based on a data fragment, wherein a size of the data fragment is set according to a convergence trend of a loss function of the first discriminative model and an object distribution in the input data comprising the real data and the simulation data.

In conjunction with the first aspect, a first implementation of the first aspect, a second implementation of the first aspect and a third implementation of the first aspect, in a fourth implementation of the first aspect of the present application, before the inputting the simulation data generated by a simulator to a first generative adversarial network, the method further includes: generating a semantic map through a second generative adversarial network; and inputting the semantic map as priori information to the simulator.

In conjunction with the fourth implementation of the first aspect, in a fifth implementation of the first aspect of the present application, the second generative adversarial network comprises a generative model and a second discriminative model; and the generating a semantic map by using a second generative adversarial network, including: inputting a noise vector to the generative model, and generating a first semantic map by the generative model; inputting a real semantic map and the generated first semantic map to the second discriminative model, and generating an authenticity probability of the generated first semantic map by the second discriminative model; according to the authenticity probability, training the second generative adversarial network by competing and learning with the generative model and the second discriminative model; and generating the semantic map by the trained second generative adversarial network.

In conjunction with the first aspect, a first implementation of the first aspect, a second implementation of the first aspect and a third implementation of the first aspect, in a sixth implementation of the first aspect of the present application, the optimizing the simulation data generated by the simulator with the migration model to generate optimized simulation data further includes: for each scenario, setting a controller vector; and inputting the controller vector in a feed process of the migration model to generate the optimized simulation data.

According to a second aspect, a device for optimizing simulation data including: a simulation data inputting unit, configured to input the simulation data generated by a simulator to a first generative adversarial network including a migration model; and a simulation data optimizing unit, configured to optimize the simulation data generated by the simulator with the migration model to generate optimized simulation data.

In conjunction with the second aspect, in a first implementation of the second aspect of the present application, the first generative adversarial network further includes a first discriminative model; the device further comprises a training unit including: a first sub-unit, configured to input the simulation data generated by the simulator to the migration model, optimize the simulation data generated by the simulator with the migration model, and output a first optimized simulation data; a second sub-unit, configured to input real data and the first optimized simulation data to the first discriminative model, and generate an authenticity probability of the first optimized simulation data by the first discriminative model; and a third sub-unit, configured to, according to the authenticity probability, train the first generative adversarial network by competing and learning with the migration model and the first discriminative model.

In conjunction with the second aspect, in a second implementation of the second aspect of the present application, the simulation data optimizing unit is further configured to: in a feed process of the migration model, generate loss output data of each sub-network of the migration model by using a residual neural network; combine the loss output data of all sub-networks and input data to obtain combined data, and provide the combined data to a loss function of the migration model to update the loss function; and optimize the simulation data generated by the simulator through the updated loss function.

In conjunction with the first implementation of the second aspect, in a third implementation of the second aspect of the present application, the second sub-unit is further configured to: perform statistical analysis to a loss degree of the first discriminative model based on a data fragment, wherein a size of the data fragment is set according to a convergence trend of a loss function of the first discriminative model and an object distribution in the input data comprising the real data and the simulation data.

In conjunction with the second aspect, a first implementation of the second aspect, a second implementation of the second aspect and a third implementation of the second aspect, in a fourth implementation of the second aspect of the present application, further including: a semantic map generating unit, configured to generate a semantic map through a second generative adversarial network; and a semantic map inputting unit, configured to input the semantic map as priori information to the simulator.

In conjunction with the fourth implementation of the second aspect, in a fifth implementation of the second aspect of the present application, the second generative adversarial network comprises a generative model and a second discriminative model; and the semantic map generating unit is configured to: input a noise vector to the generative model, and generating a first semantic map by the generative model; input a real semantic map and the generated first semantic map to the second discriminative model, and generate an authenticity probability of the generated first semantic map by the second discriminative model; according to the authenticity probability, train the second generative adversarial network by competing and learning with the generative model and the second discriminative model; and generate the semantic map by the trained second generative adversarial network.

In conjunction with the second aspect, a first implementation of the second aspect, a second implementation of the second aspect and a third implementation of the second aspect, in a sixth implementation of the second aspect of the present application, the simulation data optimizing unit is further configured to: for each scenario, set a controller vector; and input the controller vector in a feed process of the migration model to generate the optimized simulation data.

In a possible design, the device for optimizing simulation data includes a processor and a storage, the storage is configured to store a program for supporting the above method for optimizing simulation data executed by the device for optimizing simulation data, the processor is configured to execute the program stored in the storage. The device for optimizing simulation data further includes a communication interface configured for communication between the device for optimizing simulation data and another device or communication network.

In a third aspect, a device for optimizing simulation data is provided according to an embodiment of the present application, the device includes: one or more processors; and a storage device configured for storing one or more programs, wherein the one or more programs are executed by the one or more processors to enable the one or more processors to implement the method according to the first aspect.

In a fourth aspect, a computer-readable storage medium is provided for storing computer software instructions used by the device for optimizing simulation data, the computer software instructions include programs involved in execution of any one of the above method for optimizing simulation data.

One of the above technical solutions has the following advantages or beneficial effects: the simulation data is optimized by the generative adversarial network to enable the simulation data to be closer to the real data in representation. Therefore, the quality and accuracy of the simulation data can be ensured, the validity and reliability of the simulation data can be improved to some extent, and the cost for constructing the simulator can also be reduced.

The above summary is for the purpose of the specification only and is not intended to be limiting in any way. In addition to the illustrative aspects, embodiments, and features described above, further aspects, embodiments, and features of the present application will be readily understood by reference to the drawings and the following detailed description.

BRIEF DESCRIPTION OF THE DRAWINGS

In the drawings, unless otherwise specified, identical reference numerals will be used throughout the drawings to refer to identical or similar parts or elements. The drawings are not necessarily drawn to scale. It should be understood that these drawings depict only some embodiments disclosed in accordance with the present application and are not to be considered as limiting the scope of the present application.

DETAILED DESCRIPTION OF EMBODIMENT(S)

In the following, only certain exemplary embodiments are briefly described. As those skilled in the art would realize, the described embodiments may be modified in various different ways, all without departing from the spirit or scope of the present application. Accordingly, the drawings and description are to be regarded as illustrative in nature and not restrictive.

GAN (Generative Adversarial Networks) is a deep learning model. The model includes a Generative Model ("G" for short) and a Discriminative Model ("D" for short). Good output may be generated by competing and learning with the two models. In practice, a deep neural network is generally used as the Generative model (G) and/or the Discriminative model (D).

Figure 1:
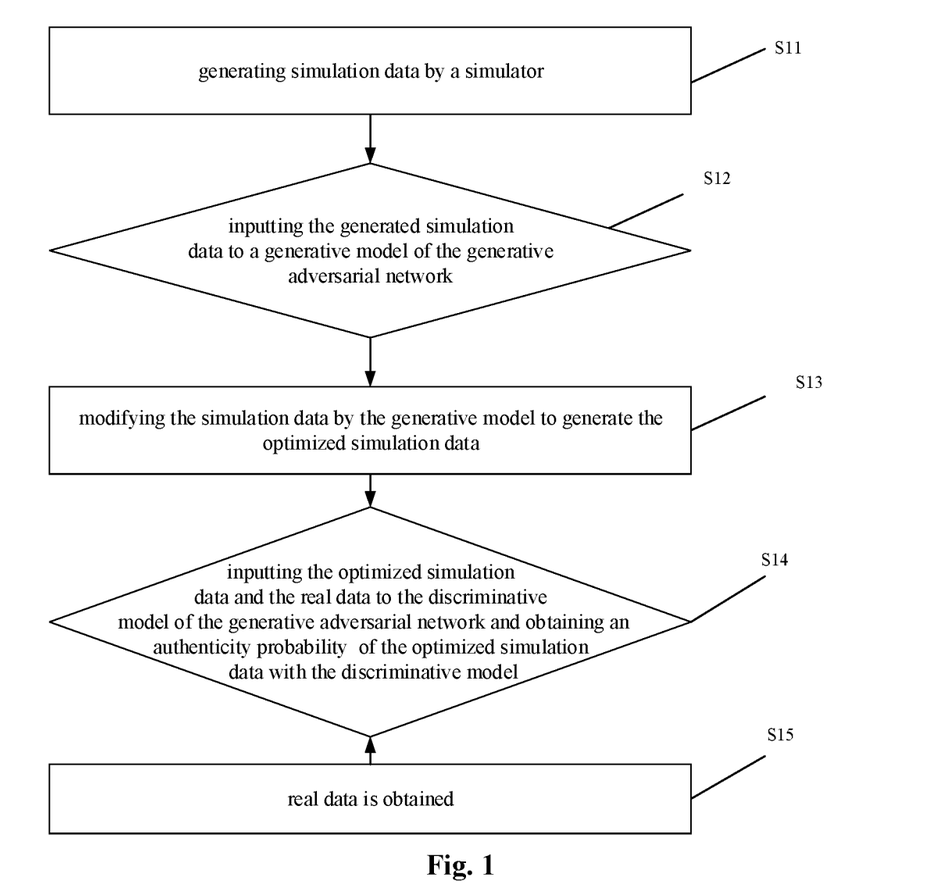
FIG. 1 is a schematic diagram of generative adversarial network of a method for optimizing simulation data according to an embodiment of the present application.

FIG. 1 is a schematic diagram of a generative adversarial network of a method for optimizing simulation data according to an embodiment of the present application. As shown in FIG. 1, in S11, simulation data is generated by a simulator; in S12, the generated simulation data is input to a generative model of the generative adversarial network; in Step S13, the simulation data is modified by the generative model to generate the optimized simulation data; then, in S15, real data is obtained; and in S14, the optimized simulation data and the real data are input to the discriminative model of the generative adversarial network, and an authenticity probability of the optimized simulation data is obtained with the discriminative model. In a case that the authenticity probability is 1, a discriminative result in which the simulation data is 100% real is obtained, which means that a very good optimization effect is obtained, and the optimized simulation data is almost identical with the real data. In a case that the authenticity probability is 0, a discriminative result in which the optimized simulation data is absolutely not the real data, which means that a poor optimization effect is obtained, and the simulation data differs from the real data greatly.

In a training course of the generative adversarial network, it is intended to use the generative model to create an image as real as possible, so as to deceive the discriminative model. Meanwhile, it is intended to use the discriminative model to distinguish the data generated by generative model from the real data. In this way, by using G and D, a dynamic "game process" is performed.

Finally, as an optimal result, data that can be determined to be real data may be generated by the generative model. In this case, it is difficult to use the discriminative model to determine whether the data generated by the generative model to be real or not, and thus the authenticity probability output by the discriminative model is 0.5. In this way, through the "game process", a generative model G is finally acquired, which can be used to optimize the simulation data.

Figure 2:
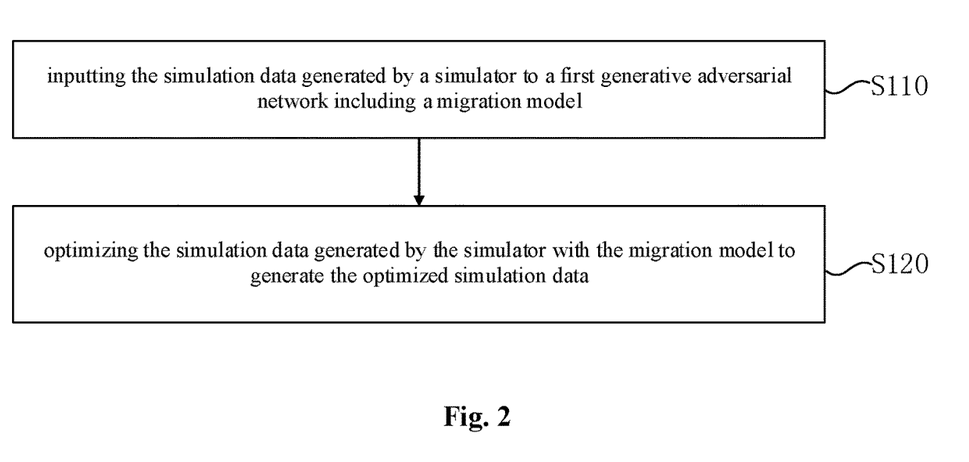
FIG. 2 is a flowchart of a method for optimizing simulation data according to another embodiment of the present application.

FIG. 2 is a flowchart of a method for optimizing simulation data according to another embodiment of the present application. As shown in FIG. 2, the method for optimizing simulation data in this embodiment of the present application includes the following steps: Step S110: inputting the simulation data generated by a simulator to a first generative adversarial network including a migration model; and Step S120: optimizing the simulation data generated by the simulator with the migration model to generate the optimized simulation data.

In the embodiment of the present application, the simulation data is modified with the generative adversarial network, so that the simulation data is closer to the real data in statistical distribution and a better optimization result of the simulation data can be obtained. For example, the optimized simulation data can be used to solve the issues of image classification, object detection and object segmentation.

The information input to the generative model in a traditional generative adversarial network is a noise vector. In the present application, the migration model is used instead of the generative mode in the traditional generative adversarial network. A domain adaptive modeling is performed by the migration model to the inaccurate simulation data output by the simulator, so as to obtain optimized simulation data closer to the real data. As such, for example, it improves the capability of the simulation data for describing different substances in the real world. The input of the migration model is original simulation data, and the output thereof is the optimized simulation data of the original simulation data after being modified.

The simulation data generated by the simulator is optimized with the migration model in the embodiment of the present application. Under the same conditions, requirements on a performance index of the simulator are reduced and the cost for constructing the simulator is also reduced.

Figure 3:
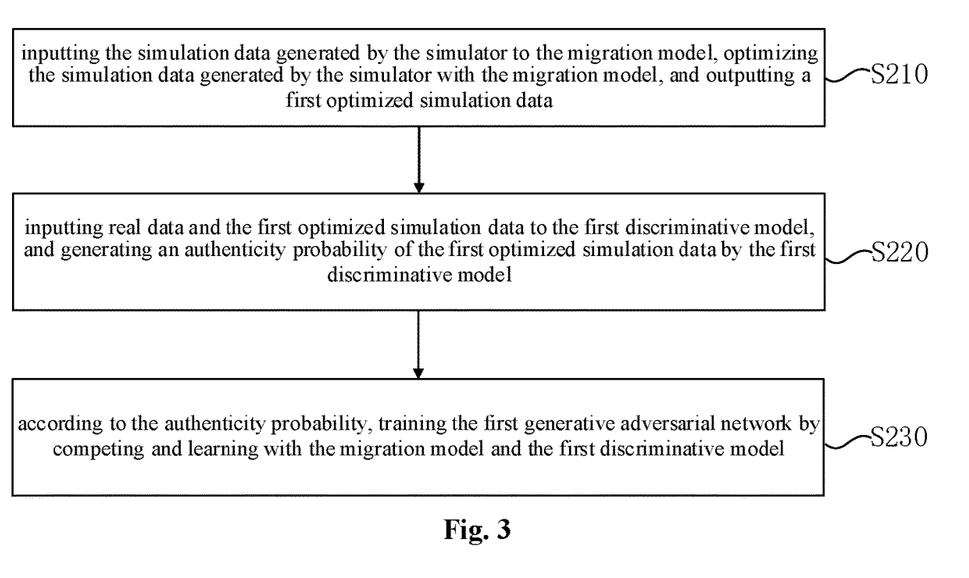
FIG. 3 is a network training flowchart of a method for optimizing simulation data according to another embodiment of the present application.

FIG. 3 is a network training flowchart of a method for optimizing simulation data according to another embodiment of the present application. As shown in FIG. 3, in a possible implementation, the first generative adversarial network further includes a first discriminative model; the method further includes the following steps to train the first generative adversarial network: Step S210: inputting the simulation data generated by the simulator to the migration model, optimizing the simulation data generated by the simulator with the migration model, and outputting a first optimized simulation data; Step S220: inputting real data and the first optimized simulation data to the first discriminative model, and generating an authenticity probability of the first optimized simulation data by the first discriminative model; and Step S230: according to the authenticity probability, training the first generative adversarial network by competing and learning with the migration model and the first discriminative model.

In a specific scenario, a threshold of the authenticity probability can be set according to the accuracy required for the simulation. For example, in a case that the authenticity probability is set between 0.45 and 0.55, it can be considered that a desired effect is achieved by the model training and the model training is completed for optimizing the simulation data.

In a possible implementation, the optimizing the simulation data generated by the simulator with the migration model, and outputting the optimized simulation data includes: in a feed process of the migration model, generating loss output data of each sub-network of the migration model by using a residual neural network; combining the loss output data of all sub-networks and input data to obtain combined data, and providing the combined data to a loss function of the migration model to update the loss function; and optimizing the simulation data generated by the simulator through the updated loss function.

In the migration model, the input and output are combined with the deep residual network to acquire the simulation data with an improved quality finally. Statistical information with different resolutions may be generated in performing data processing by the migration model. Statistical information with a high resolution reflects more details, while the statistical information with a low resolution reflects a global feature. Requirements for data processing with different resolutions correspond to requirements for different sampling rates. In order to avoid losing detailed information during the feed process, the outputs of all sub-blocks constructing the network are taken as a part of the input of the loss function, so as to strengthen the guiding effect of the loss function for the network.

In a possible implementation, dilated convolution is used for maintaining information, such as detail information of a feature graph, so as to avoid losing details due to down sampling. The dilated convolution differs from common convolution in that the dilated convolution has a larger receptive field. The receptive field is a size of the convolution kernel on an image, for example, the size of the receptive field for a 3×3 convolution kernel is 9. Details may be lost in a down-sampling process by using the common convolution, which can be effectively avoided by maintaining information with the dilated convolution.

In addition, in the process of the data processing with the migration model, considering the discreteness of point cloud data in detail and continuity of a real-world object, the continuity of an object may be described by converting original information input to the migration model to local statistical information. For example, local information integration of discrete data may be information integration at a pixel level, such that the integrated data is suitable for describing continuity of an object. Moreover, statistical information of different dimensions is applied simultaneously, and the dimension of statistical information is selected according to actual demands of data optimization, facilitating to make a tradeoff to different extents between discreteness and continuity. For example, three-dimensional data can be projected to a two-dimensional plane, thus increasing the data density to effectively solve a problem of data sparsity.

In a possible implementation, the optimizing the simulation data generated by the simulator with the migration model further includes: embedding an attention model in the loss function of the migration model to obtain respective attention degrees for features of the migration model. By embedding the attention model in the loss function, an attention degrees for foreground and background, an object, or a distance can be represented. Control of the attention is self-adaptive, mainly based on a convergence of the network and a backward propagation gradient of the network.

In a possible implementation, the optimizing the simulation data generated by the simulator with the migration model further includes: inputting semantic information and boundary information of the object into the migration model as priori information, to verify a loss degree of the migration model. Semantic information of the object includes tags in the point cloud information. The object to be detected that generates the point cloud information can be acquired through tags, such as a building, a car, a tree, and the like. The semantic information and the boundary information of the object can be used as priori information of models to support network training.

In a possible implementation, the generating an authenticity probability of the first optimized simulation data by the first discriminative model further includes: performing statistics analysis to a loss degree of the first discriminative model based on a fragment level, wherein a size of the data fragment is set according to a convergence trend of a loss function of the first discriminative model and an object distribution in the input data including the real data and the simulation data.

The input information of the first discriminative model is the real data and the simulation data output from the migration model, and the output information is the authenticity probability of the simulation data output from the migration model. In a case that the authenticity probability is 1, the simulation data output from the migration model is real. In a case that the authenticity probability is 0, the simulation data output from the migration model is not real. In a case that it is 0.5, it is difficult to determine whether the simulation data output from the migration model is real or not.

Compared with a design of the loss function of a traditional discriminative model, in the embodiment of the present application, the statistical analysis to the loss degree of the first discriminative model is performed based on neither a pixel level, nor an integer-image level, but based on a data fragment. In one implementation, the size of the data fragment can be set according to the convergence trend of the network, that is, the convergence trend of the loss function based on self-adaption. For example, the set value of the size may be relatively large at the beginning of training. With the converging of the network, the set value of the size can be reduced gradually. In another implementation, the size can be set according to the object distribution in the input data based on self-adaption. The object distribution in the input data may include the number of objects to be detected in the point cloud information of the input data. The object distribution in the input data can be obtained from the semantic information of the object in the point cloud information. For example, information of how many vehicles in the point cloud information of the input data can be acquired. In a case that the number of objects to be detected in the point cloud information of the input data is large, the size can be set smaller accordingly. Otherwise, in a case that the number of objects to be detected in the point cloud information of the input data is small, the size can be set larger accordingly. In a case of different sizes, a standardized operation, such as a normalized operation, can be performed to fragment sizes, so as to maintain smoothness of the loss curve.

In a possible implementation, before the inputting the simulation data generated by a simulator to a first generative adversarial network, the method further includes: generating a semantic map through a second generative adversarial network; and inputting the semantic map as priori information to the simulator.

The semantic map includes semantic information of the object, that is, tags in the point cloud information. For example, the object to be detected can be labeled as a building, a car, a tree and the like with a tag. By generating the semantic map through a generative adversarial network, it is possible to set the semantic information, such as geographical distribution and morphological representation of a foreground object, scene arrangement of background environment within an effective range of the point cloud data. The semantic map is input to the simulator to provide priori information for the simulator to generate the simulation data, thereby reducing the simulator workload, performance index requirements of the simulator, and construction costs of the simulator. The generated data from the traditional simulator deviates from the real data to a certain extent, and thus the semantic map is often generated randomly in order to increase the validity. Generating a semantic map randomly has a negative effect on the simulation data, since agitation errors may be caused by random factors. In the embodiments of the present application, the semantic map as priori information is inputted to the simulator to reduce the agitation errors caused by the excessive random factors added to the system.

Figure 4:
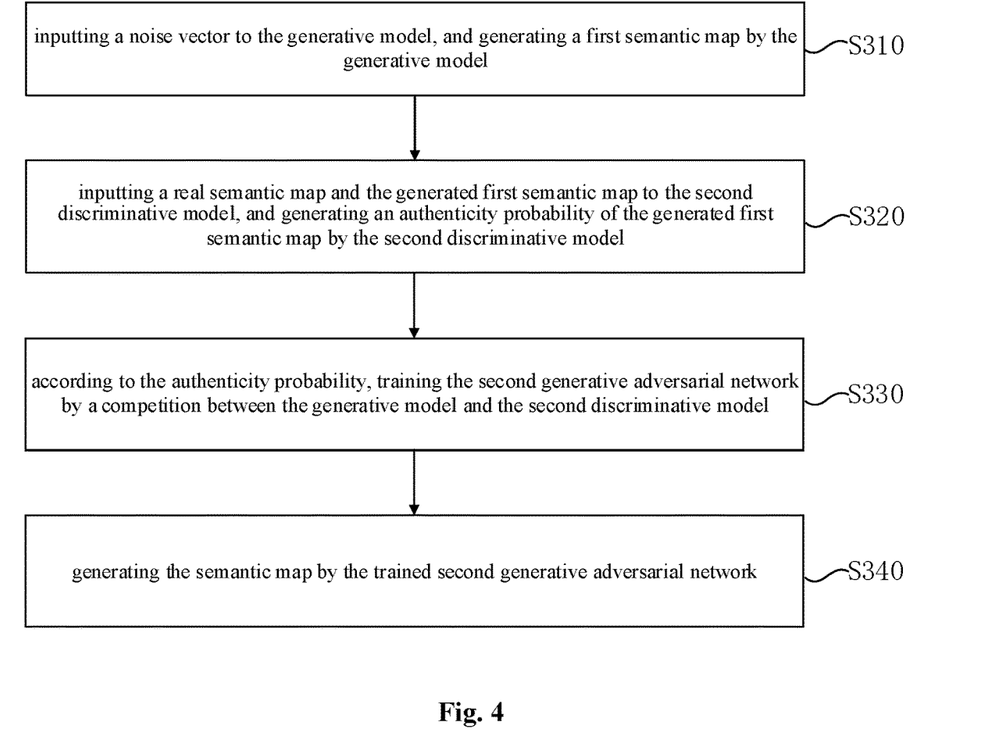
FIG. 4 is a flowchart of semantic map generation in a method for optimizing simulation data according to another embodiment of the present application.

FIG. 4 is a flowchart of generating a semantic map in a method for optimizing simulation data according to another embodiment of the present application. As shown in FIG. 4, in a possible implementation, the second generative adversarial network includes a generative model and a second discriminative model; and the generating a semantic map by using a second generative adversarial network, including: Step S310: inputting a noise vector to the generative model, and generating a first semantic map by the generative model; Step S320: inputting a real semantic map and the generated first semantic map to the second discriminative model, and generating an authenticity probability of the generated first semantic map by the second discriminative model; Step S330: according to the authenticity probability, training the second generative adversarial network by a competing and learning with the generative model and the second discriminative model; and Step S340: generating the semantic map by the trained second generative adversarial network.

The input information of the generative model is a noise vector, and the output information is a first semantic map. The input information of the discriminating model is the real semantic map and the first semantic map output from the generative model, and the output information thereof is the probability that the semantic map output from the generative model is the real semantic map.

By generating the semantic maps through the generative adversarial network, it is possible to set the semantic information, such as geographical distribution and morphological representation of a foreground object, scene arrangement of background environment and the like within an effective range of the point cloud data, so that the number of training samples can be increased, and the content of training samples can be enriched.

In a possible implementation, the optimizing the simulation data generated by the simulator by using the migration model to generate optimized simulation data further includes: for each scenario, setting a controller vector; and inputting the controller vector in a feed process of the migration model to generate the optimized simulation data.

In this implementation, the controller vector is set and implanted into the generative model as an intermediate condition of the model. For example, the controller vector can be input in the forward propagation process of the neural network, the controller vector is combined with the forward propagation result of the neural network to proceed the forward propagation. By supervised learning, semantic information of the controller output by the network is corrected by the controller vector through loss calculation to enable the network to control the simulation data of different scenarios (e.g., weather).

For example, the controller vector represents the weather condition, and elements in the controller vector can be set to be as follows: 0 for sunny days, 1 for cloudy days, and the like. The controller vector is entered into the generative model to generate simulation data under different weather conditions.

The above-mentioned technical schemes have the following advantages or beneficial effects: the simulation data is optimized by the generative adversarial network to enable the simulation data more to be closer to the real data in representation. Therefore, the quality and precision of the simulation data can be ensured, and the validity and reliability of the simulation data can be improved to some extent, and the cost for constructing the simulator can also be reduced.

Figure 5:
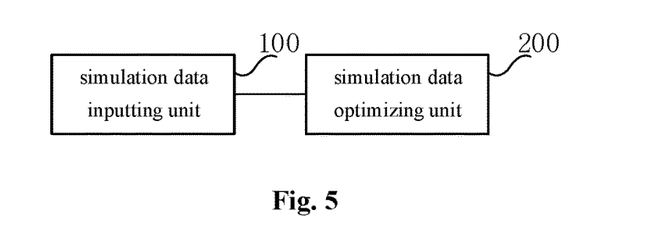
FIG. 5 is a structural block diagram of a device for optimizing simulation data according to an embodiment of the present application.

FIG. 5 is a structural block diagram of a device for optimizing simulation data according to an embodiment of the present application. As shown in FIG. 5, A device for optimizing simulation data including: a simulation data inputting unit 100, configured to input the simulation data generated by a simulator to a first generative adversarial network including a migration model; and a simulation data optimizing unit 200, configured to optimize the simulation data generated by the simulator with the migration model to generate optimized simulation data.

Figure 6:
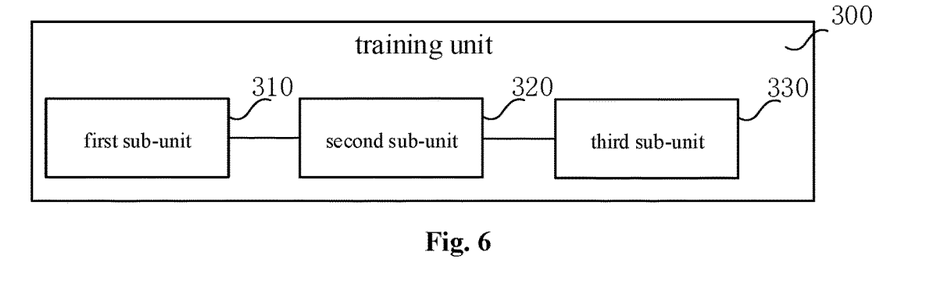
FIG. 6 is a structural block diagram of a training unit of a device for optimizing simulation data according to another embodiment of the present application.
Figure 7:
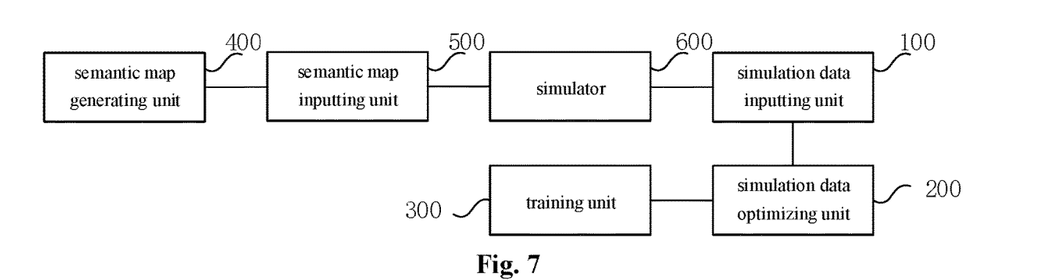
FIG. 7 is a structural block diagram of a device for optimizing simulation data according to another embodiment of the present application.

FIG. 6 is a structural block diagram of a training unit of a device for optimizing simulation data according to another embodiment of the present application. FIG. 7 is a structural block diagram of a device for optimizing simulation data according to another embodiment of the present application. As shown in FIG. 6 and FIG. 7, in a possible implementation, the first generative adversarial network further comprises a first discriminative model; and the device further comprises a training unit 300 including: a first sub-unit 310, configured to input the simulation data generated by the simulator to the migration model, optimize the simulation data generated by the simulator with the migration model, and output a first optimized simulation data; a second sub-unit 320, configured to input real data and the first optimized simulation data to the first discriminative model, and generate an authenticity probability of the first optimized simulation data by the first discriminative model; and a third sub-unit 330, configured to, according to the authenticity probability, train the first generative adversarial network by competing and learning with the migration model and the first discriminative model.

In a possible implementation, the simulation data optimizing unit 200 is further configured to: in a feed process of the migration model, generate loss output data of each sub-network of the migration model by using a residual neural network; combine the loss output data of all sub-networks and input data to obtain combined data, and provide the combined data to a loss function of the migration model to update the loss function; and optimize the simulation data generated by the simulator through the updated loss function.

In a possible implementation, the second sub-unit 320 is further configured to: perform statistical analysis to a loss degree of the first discriminative model based on a data fragment, wherein a size of the data fragment is set according to a convergence trend of a loss function of the first discriminative model and an object distribution in the input data comprising the real data and the simulation data.

Referring to FIG. 7, in a possible implementation, the further comprising: a semantic map generating unit 400, configured to generate a semantic map through a second generative adversarial network; and a semantic map inputting unit 500, configured to input the semantic map as priori information to the simulator 600.

In a possible implementation, the second generative adversarial network includes a generative model and a second discriminative model; and the semantic map generating unit 400 is configured to: input a noise vector to the generative model, and generating a first semantic map by the generative model; input a real semantic map and the generated first semantic map to the second discriminative model, and generate an authenticity probability of the generated first semantic map by the second discriminative model; according to the authenticity probability, train the second generative adversarial network by competing and learning with the generative model and the second discriminative model; and generate the semantic map by the trained second generative adversarial network.

In a possible implementation, the simulation data optimizing unit 200 is further configured to: for each scenario, set a controller vector; and input the controller vector in a feed process of the migration model to generate the optimized simulation data.

In this embodiment, functions of modules in the device refer to the corresponding description of the above mentioned method and thus the description thereof is omitted herein.

In a possible design, the device for optimizing simulation data includes a processor and a storage, the storage is configured to store a program for supporting the above method for optimizing simulation data executed by the device, and the processor is configured to execute the program stored in the storage. The device for optimizing simulation data further includes a communication interface configured for communication between the device for optimizing simulation data and another device or communication network.

Figure 8:
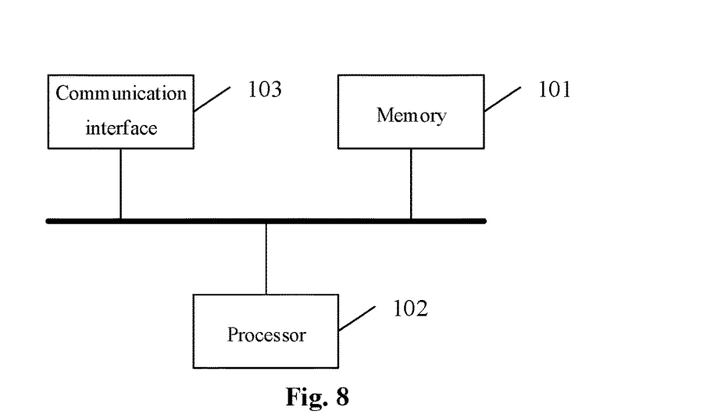
FIG. 8 is another structural block diagram of a device for optimizing simulation data according to another embodiment of the present application.

FIG. 8 is another structural block diagram of a device for optimizing simulation data according to another embodiment of the present application. As shown in FIG. 8, the device includes a memory 101 and a processor 102. The memory 101 stores a computer program executable on the processor 102. When the processor 102 executes the computer program, the service data promotion method in the foregoing embodiment is implemented. The number of the memory 101 and the processor 102 may be one or more.

The device further includes:

a communication interface 103 configured to communicate with an external device and exchange data.

The memory 101 may include a high-speed RAM memory and may also include a non-volatile memory, such as at least one magnetic disk memory.

If the memory 101, the processor 102, and the communication interface 103 are implemented independently, the memory 101, the processor 102, and the communication interface 103 may be connected to each other through a bus and communicate with one another. The bus may be an Industry Standard Architecture (ISA) bus, a Peripheral Component (PCI) bus, an Extended Industry Standard Component (EISA) bus, or the like. The bus may be divided into an address bus, a data bus, a control bus, and the like. For ease of illustration, only one bold line is shown in FIG. 8, but it does not mean that there is only one bus or one type of bus.

Optionally, in a specific implementation, if the memory 101, the processor 102, and the communication interface 103 are integrated on one chip, the memory 101, the processor 102, and the communication interface 103 may implement mutual communication through an internal interface.

According to an embodiment of the present application, a computer-readable storage medium is provided for storing computer software instructions, which include programs involved in execution of the above method for optimizing simulation data.

In the description of the specification, the description of the terms "one embodiment," "some embodiments," "an example," "a specific example," or "some examples" and the like means the specific features, structures, materials, or characteristics described in connection with the embodiment or example are included in at least one embodiment or example of the present application. Furthermore, the specific features, structures, materials, or characteristics described may be combined in any suitable manner in any one or more of the embodiments or examples. In addition, different embodiments or examples described in this specification and features of different embodiments or examples may be incorporated and combined by those skilled in the art without mutual contradiction.

In addition, the terms "first" and "second" are used for descriptive purposes only and are not to be construed as indicating or implying relative importance or implicitly indicating the number of indicated technical features. Thus, features defining "first" and "second" may explicitly or implicitly include at least one of the features. In the description of the present application, "a plurality of" means two or more, unless expressly limited otherwise.

Any process or method descriptions described in flowcharts or otherwise herein may be understood as representing modules, segments or portions of code that include one or more executable instructions for implementing the steps of a particular logic function or process. The scope of the preferred embodiments of the present application includes additional implementations where the functions may not be performed in the order shown or discussed, including according to the functions involved, in substantially simultaneous or in reverse order, which should be understood by those skilled in the art to which the embodiment of the present application belongs.

Logic and/or steps, which are represented in the flowcharts or otherwise described herein, for example, may be thought of as a sequencing listing of executable instructions for implementing logic functions, which may be embodied in any computer-readable medium, for use by or in connection with an instruction execution system, device, or apparatus (such as a computer-based system, a processor-included system, or other system that fetch instructions from an instruction execution system, device, or apparatus and execute the instructions). For the purposes of this specification, a "computer-readable medium" may be any device that may contain, store, communicate, propagate, or transport the program for use by or in connection with the instruction execution system, device, or apparatus. More specific examples (not a non-exhaustive list) of the computer-readable media include the following: electrical connections (electronic devices) having one or more wires, a portable computer disk cartridge (magnetic device), random access memory (RAM), read only memory (ROM), erasable programmable read only memory (EPROM or flash memory), optical fiber devices, and portable read only memory (CDROM). In addition, the computer-readable medium may even be paper or other suitable medium upon which the program may be printed, as it may be read, for example, by optical scanning of the paper or other medium, followed by editing, interpretation or, where appropriate, process otherwise to electronically obtain the program, which is then stored in a computer memory.

It should be understood that various portions of the present application may be implemented by hardware, software, firmware, or a combination thereof. In the above embodiments, multiple steps or methods may be implemented in software or firmware stored in memory and executed by a suitable instruction execution system. For example, if implemented in hardware, as in another embodiment, they may be implemented using any one or a combination of the following techniques well known in the art: discrete logic circuits having a logic gate circuit for implementing logic functions on data signals, application specific integrated circuits with suitable combinational logic gate circuits, programmable gate arrays (PGA), field programmable gate arrays (FPGAs), and the like.

Those skilled in the art may understand that all or some of the steps carried in the methods in the foregoing embodiments may be implemented by a program instructing relevant hardware. The program may be stored in a computer-readable storage medium, and when executed, one of the steps of the method embodiment or a combination thereof is included.

In addition, each of the functional units in the embodiments of the present application may be integrated in one processing module, or each of the units may exist alone physically, or two or more units may be integrated in one module. The above-mentioned integrated module may be implemented in the form of hardware or in the form of software functional module. When the integrated module is implemented in the form of a software functional module and is sold or used as an independent product, the integrated module may also be stored in a computer-readable storage medium. The storage medium may be a read only memory, a magnetic disk, an optical disk, or the like.

The foregoing descriptions are merely specific embodiments of the present application, but not intended to limit the protection scope of the present application. Those skilled in the art may easily conceive of various changes or modifications within the technical scope disclosed herein, all these should be covered within the protection scope of the present application. Therefore, the protection scope of the present application should be subject to the protection scope of the claims.

What is claimed is:

1. A method for optimizing simulation data, comprising:
   inputting the simulation data generated by a simulator to a first generative adversarial network comprising a migration model; and
   optimizing the simulation data generated by the simulator with the migration model to generate optimized simulation data, wherein a domain adaptive modeling is performed by the migration model to the simulation data generated by the simulator;
   wherein optimizing the simulation data generated by the simulator with the migration model further comprises:
   embedding an attention model in a loss function of the migration model to obtain respective attention degrees for features of the migration model; and
   inputting semantic information of an object and boundary information of the object into the migration model as a priori information, to verify a loss degree of the migration model, wherein the semantic information of the object comprises a tag in point cloud information, the tag being used for representing the object;
   wherein the simulation data comprises at least a discrete point cloud, and
   wherein the method further comprises:
   converting the discrete point cloud input to the migration model to local statistical information by:
   performing local information integration of the discrete point cloud at a pixel level to enable integrated data to be suitable for describing continuity of the object.

2. The method according to claim 1, wherein the first generative adversarial network further comprises a first discriminative model; and
   the method further comprises training the first generative adversarial network by:
   inputting the simulation data generated by the simulator to the migration model, optimizing the simulation data generated by the simulator with the migration model, and outputting a first optimized simulation data;
   inputting real data and the first optimized simulation data to the first discriminative model, and generating an authenticity probability of the first optimized simulation data by the first discriminative model; and
   according to the authenticity probability, training the first generative adversarial network by competing and learning with the migration model and the first discriminative model.

3. The method according to claim 1, wherein the optimizing the simulation data generated by the simulator with the migration model to generate optimized simulation data comprises:
   in a feed process of the migration model, generating loss output data of each sub-network of the migration model by using a residual neural network;
   combining the loss output data of all sub-networks and input data to obtain combined data, and providing the combined data to a loss function of the migration model to update the loss function; and optimizing the simulation data generated by the simulator through the updated loss function.

4. The method according to claim 2, wherein the generating the authenticity probability of the first optimized simulation data by the first discriminative model comprises:

performing statistical analysis to a loss degree of the first discriminative model based on a data fragment, wherein a size of the data fragment is set according to a convergence trend of a loss function of the first discriminative model and an object distribution of input data comprising the real data and the simulation data.

5. The method according to claim 1, wherein before the inputting the simulation data generated by the simulator to the first generative adversarial network, the method further comprises:

generating a semantic map through a second generative adversarial network; and inputting the semantic map as a priori information to the simulator.

6. The method according to claim 5, wherein the second generative adversarial network comprises a generative model and a second discriminative model; and the generating the semantic map by using the second generative adversarial network, comprising:

inputting a noise vector to the generative model, and generating a first semantic map by the generative model;

inputting a real semantic map and the generated first semantic map to the second discriminative model, and generating an authenticity probability of the generated first semantic map by the second discriminative model;

according to the authenticity probability, training the second generative adversarial network by competing and learning with the generative model and the second discriminative model; and generating the semantic map by the trained second generative adversarial network.

7. The method according to claim 1, wherein the optimizing the simulation data generated by the simulator with the migration model to generate optimized simulation data comprises:

for each scenario, setting a controller vector; and inputting the controller vector in a feed process of the migration model to generate the optimized simulation data.

8. A non-transitory computer-readable storage medium, in which a computer program is stored, wherein the computer program, when executed by a processor, implements the method of claim 1.

9. The method according to claim 1, wherein the domain adaptive modeling is configured to output optimized simulation data by correcting inaccuracies in the simulation data generated by the simulator.

10. The method according to claim 1, wherein the domain adaptive modeling applies adaptive modeling to the simulation data for the domains to which the simulation data is associated with.

11. The method according to claim 1, wherein statistical information of different dimensions is applied simultaneously, and a dimension of statistical information is selected according to actual demands of data optimization.

12. A device for optimizing simulation data comprising:

one or more processors; and a memory storing one or more programs, wherein the one or more programs, when executed by the one or more processors, cause the one or more processors to:

input the simulation data generated by a simulator to a first generative adversarial network comprising a migration model; and optimize the simulation data generated by the simulator with the migration model to generate optimized simulation data, wherein a domain adaptive modeling is performed by the migration model to the simulation data generated by the simulator;

wherein optimizing the simulation data generated by the simulator with the migration model further comprises:

embedding an attention model in a loss function of the migration model to obtain respective attention degrees for features of the migration model; and inputting semantic information of an object and boundary information of the object into the migration model as a priori information, to verify a loss degree of the migration model, wherein the semantic information of the object comprises a tag in point cloud information, the tag being used for representing the object, wherein the simulation data comprises at least a discrete point cloud, and wherein the one or more programs further cause the one or more processors to:

convert the discrete point cloud input to the migration model to local statistical information by:

performing local information integration of the discrete point cloud at a pixel level to enable integrated data to be suitable for describing continuity of the object.

13. The device according to claim 12, wherein the first generative adversarial network further comprises a first discriminative model; and the one or more programs are executed by the one or more processors to enable the one or more processors to:

train the first generative adversarial network by:

inputting the simulation data generated by the simulator to the migration model, optimizing the simulation data generated by the simulator with the migration model, and outputting a first optimized simulation data;

inputting real data and the first optimized simulation data to the first discriminative model, and generating an authenticity probability of the first optimized simulation data by the first discriminative model; and according to the authenticity probability, training the first generative adversarial network by competing and learning with the migration model and the first discriminative model.

14. The device according to claim 12, wherein the optimizing the simulation data generated by the simulator with the migration model, and the one or more programs are executed by the one or more processors to enable the one or more processors to:

in a feed process of the migration model, generate loss output data of each sub-network of the migration model by using a residual neural network;

combine the loss output data of all sub-networks and input data to obtain combined data, and provide the combined data to a loss function of the migration model to update the loss function; and optimize the simulation data generated by the simulator through the updated loss function.

15. The device according to claim 13, wherein the one or more programs are executed by the one or more processors to enable the one or more processors further to:

perform statistical analysis to a loss degree of the first discriminative model based on a data fragment, wherein a size of the data fragment is set according to a convergence trend of a loss function of the first discriminative model and an object distribution of input data comprising the real data and the simulation data.

16. The device according to claim 12, wherein the one or more programs are executed by the one or more processors to enable the one or more processors to:

generate a semantic map through a second generative adversarial network; and input the semantic map as a priori information to the simulator.

17. The device according to claim 16, wherein the second generative adversarial network comprises a generative model and a second discriminative model; and the one or more programs are executed by the one or more processors to enable the one or more processors to:

input a noise vector to the generative model, and generating a first semantic map by the generative model;

input a real semantic map and the generated first semantic map to the second discriminative model, and generate an authenticity probability of the generated first semantic map by the second discriminative model;

according to the authenticity probability, train the second generative adversarial network by competing and learning with the generative model and the second discriminative model; and generate the semantic map by the trained second generative adversarial network.

18. The device according to claim 12, wherein the one or more programs are executed by the one or more processors to enable the one or more processors to:

for each scenario,
set a controller vector; and
input the controller vector in a feed process of the migration model to generate the optimized simulation data.

* * * * *